United States Patent [19]

Crooks

[11] Patent Number: 4,482,866

[45] Date of Patent: Nov. 13, 1984

[54] REFERENCE LOAD AMPLIFIER CORRECTION SYSTEM

[75] Inventor: Robert C. Crooks, Huntington Beach, Calif.

[73] Assignee: Barcus-Berry, Inc., Huntington Beach, Calif.

[21] Appl. No.: 352,794

[22] Filed: Feb. 26, 1982

[51] Int. Cl.[3] .............................................. H03F 1/08

[52] U.S. Cl. .................................. 330/149; 330/105; 330/109; 330/126; 330/151; 360/68

[58] Field of Search ............... 330/102, 105, 107, 109, 330/126, 149, 151; 381/71, 94, 96, 120, 121; 360/68, 55

[56] References Cited

U.S. PATENT DOCUMENTS

| | | | |
|---|---|---|---|
| 3,207,854 | 9/1965 | Johnson | 330/126 X |
| 3,449,518 | 6/1969 | Erath | 381/96 |
| 3,493,682 | 2/1970 | Erath | 381/121 |
| 3,755,754 | 8/1973 | Putz | 330/151 X |

*Primary Examiner*—James B. Mullins
*Attorney, Agent, or Firm*—Albert L. Gabriel

[57] ABSTRACT

A system which corrects for adverse characteristics such as reactance, inertia and resonances of a power amplifier driven load such as a speaker or multiple speaker system. Program voltage is applied to a reference load which has electrical characteristics that simulate characteristics of the driven load, and the response of the reference load to the program is used to develop a correction voltage signal for the driven load. The program and the correction voltage signal are simultaneously applied to the power amplifier to simultaneously reproduce the program and correct for the adverse characteristics of the load.

42 Claims, 10 Drawing Figures

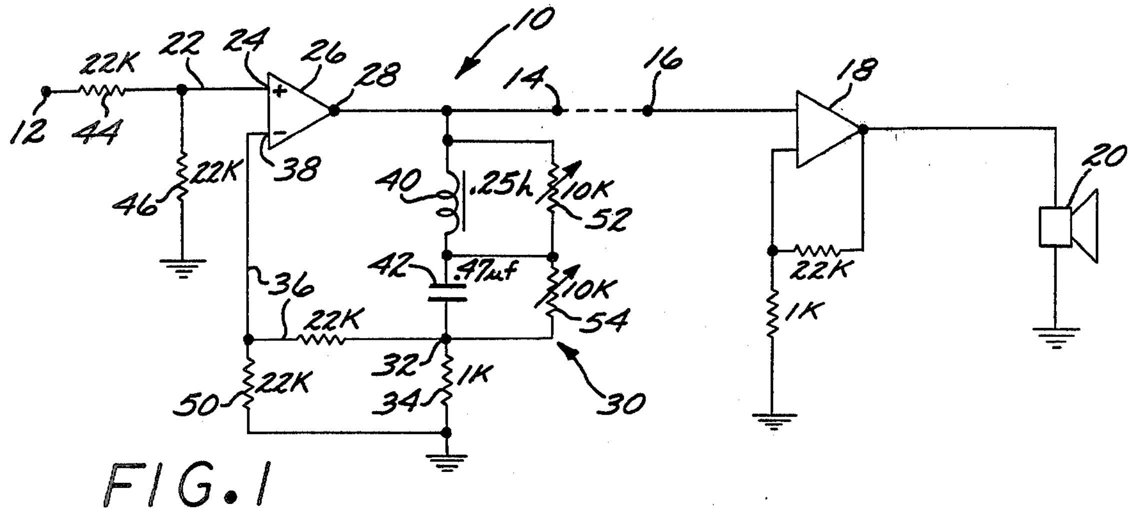
FIG. 1
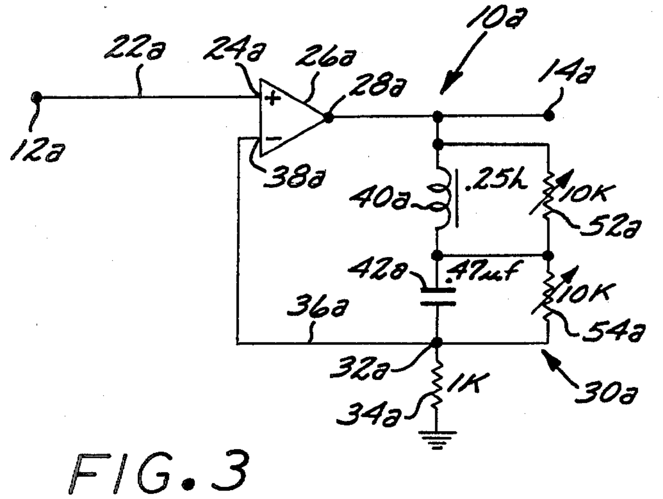
FIG. 2
FIG. 3
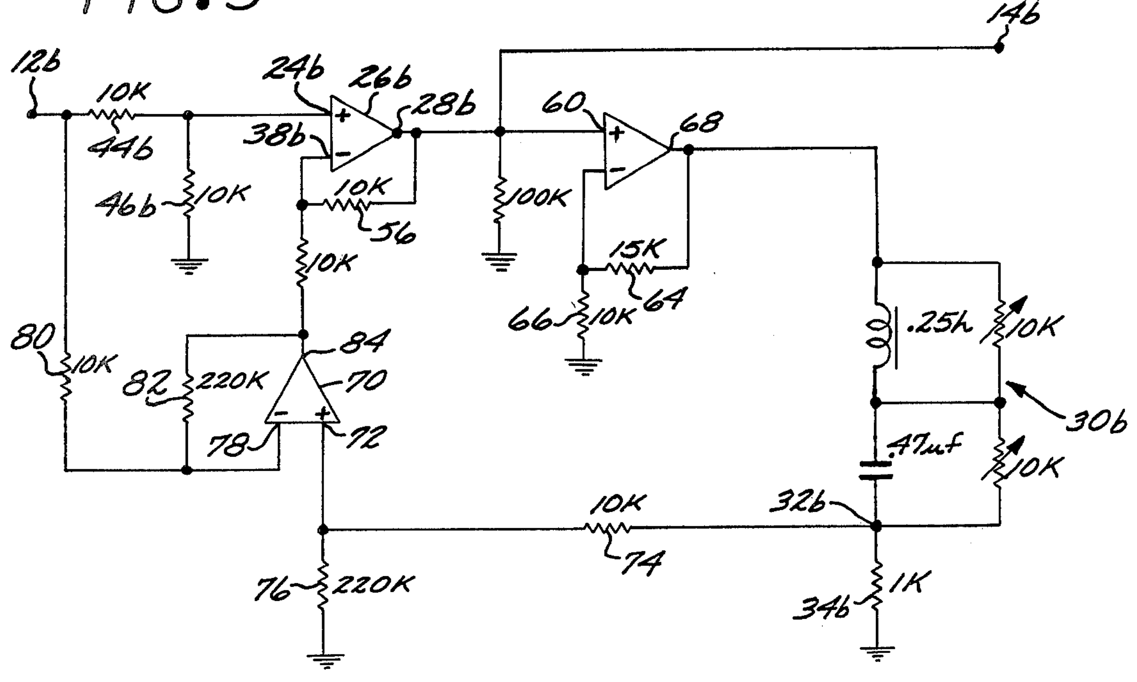

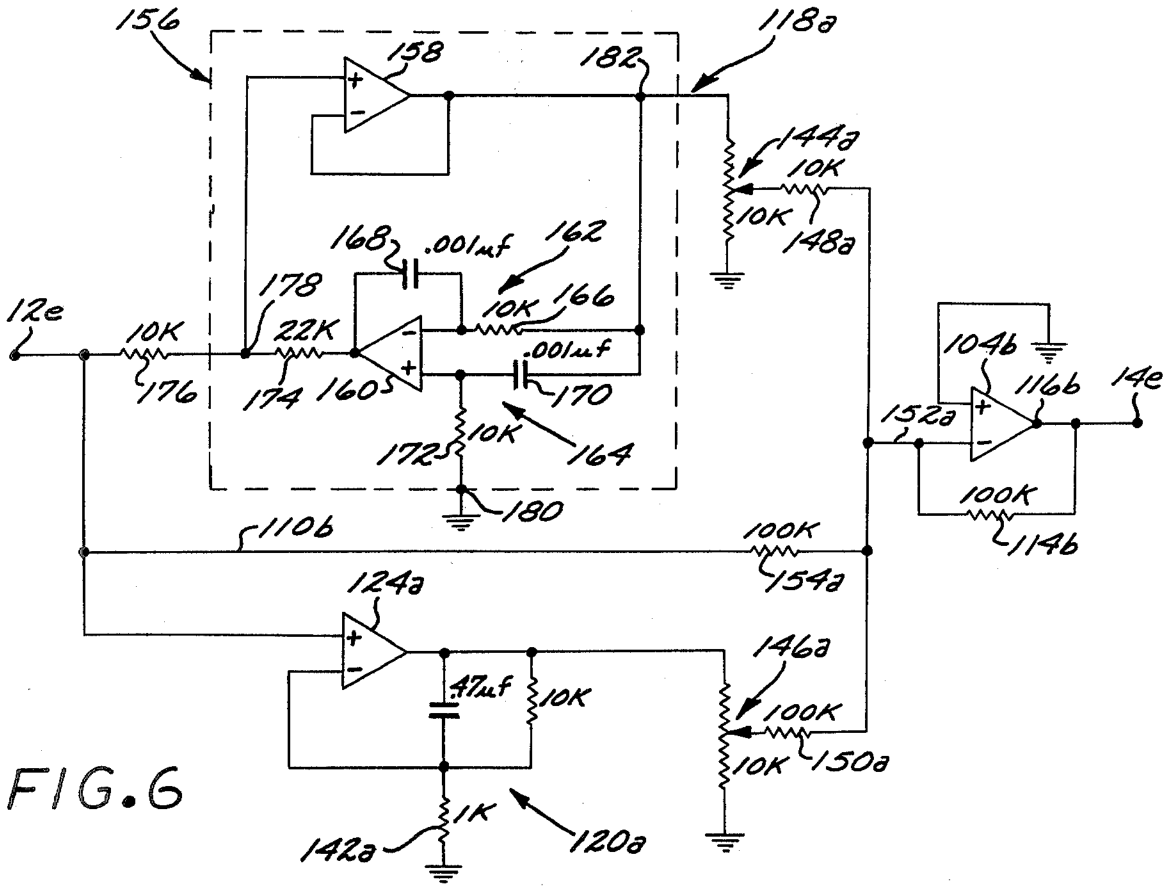
FIG. 6
FIG. 7
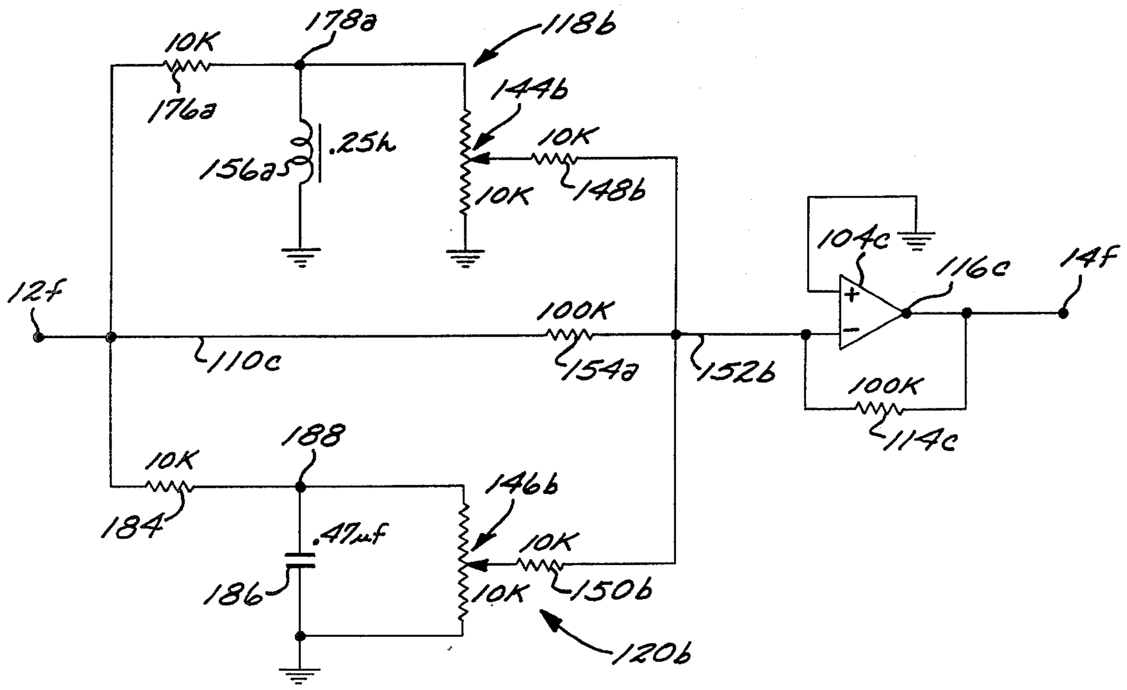

REFERENCE LOAD AMPLIFIER CORRECTION SYSTEM

BACKGROUND OF THE INVENTION

1. Field of the Invention

The present invention is in the field of amplifiers, and relates particularly to amplifiers which drive loads such as speakers that are highly reactive and are also subject to mechanical distortion influences including inertia and resonances.

2. Description of the Prior Art

For more than forty years, and still according to the current state of the art, audio amplifiers have employed what is commonly referred to as "voltage feedback" in an endeavor to improve frequency response and reduce distortion. Such voltage feedback systems are sometimes referred to in the art as "constant voltage" systems, since for a fixed amplifier input voltage the output voltage remains substantially constant over a broad frequency range or bandwidth. Thus, present audio amplifiers are capable of providing a voltage output for driving a speaker which quite accurately follows the amplifier input program voltage, as to both waveform or shape and phase.

However, the conventional magnetic coil-driven speaker (or multiple speaker system) used as a load for such amplifier is essentially a current-driven device, and it has both electrical characteristics and mechanical characteristics which seriously alter the flow of current through it independently of "constant voltage" amplifier drive, thereby preventing the speaker current from coming even close to following the voltage output of the amplifier and instead causing the speaker to depart considerably from the program applied by the amplifier in amplitude, waveform and phase. The general result is that the acoustic response of the speaker is considerably different than the flat voltage response of the "constant voltage" amplifier.

The conventional coil-driven speaker (or multiple speaker system) is a load that is highly inductively reactive. This causes the load impedance to vary with frequency, becoming higher, with power to the speaker consequently lower, as program frequencies rise above the usual 400 Hz nominal or rated impedance point all of the way out to 20 KHz and higher. By way of example, to illustrate how serious this increase in impedance at higher frequencies can be, the manufacturer's impedance/frequency response curve for a typical state-of-the-art speaker rated 8 ohms at 400 Hz shows the impedance to be doubled to 16 ohms at approxinmately 4300 Hz, and quadrupled to 32 ohms at about 10 KHz. Power is inversely proportional to impedance in a speaker.

The inductive reactance of the speaker load also causes load current to lag in phase from the program, and this phase lag increases with frequency from the 400 Hz rated impedance point all the way to the high end of the sound frequency spectrum. By way of example to show how serious this inductive reactance phase lag can be, measurements made with the speaker referred to in the immediately preceding paragraph showed a phase lag of approximately 33° at 400 Hz, approximately 45° at 900 Hz, and approximately 70° at 5 KHz. As an integral part of this inductive reactance phase lag, the rise times for high frequency wave fronts or transients which usually contain important program information are slowed way down relative to the actual wave fronts or transients in the program.

The mass of a speaker resists acceleration and deceleration in response to respective rising and falling wave fronts, resulting in inertial lag and overshoot, respectively. Inertial distortion of speaker acoustic output is surprisingly close or analogous to the phase and rise time distortions produced by the inductive reactance of a speaker, so that these effects of inductive reactance and inertia are additive. The adverse effects of inertia, like those of inductive reactance, increase with increasing frequency all of the way out to the high end of the audible spectrum.

Most sounds that are produced by musical instruments have a sharp attack that is characterized by a sharply rising initial transient wave front in each fundamental frequency cycle, this initial transient containing most of the high frequency harmonic content of the sound. It has been found that for the human ear to hear the entire spectrum of such sounds, it must receive these initial high frequency harmonic sounds first, followed then by the midrange and low end frequencies. However, the additive or cumulative effects of speaker inductive reactance and inertia in current state-of-the-art amplifier/speaker systems cause the rise time to be so slow and the phase lag to be so large at higher frequencies that the sharply rising wave fronts or initial transients which contain most of the high frequency harmonics become masked to a large extent by the lower, heavier frequencies. Such masking of the high frequency harmonics is commonly referred to as "transient distortion", and causes the acoustic output of the system to sound "artificial" or "recorded", instead of sounding completely "live" or "natural" as when the ear properly receives the sharply rising initial transient wave front in its proper order ahead of the lower frequencies.

The typical condenser microphone has a rise time of about 20 to 25 microseconds. In order to make up for the losses at the sound reproduction end, and at the same time reproduce the high frequency harmonic content in the sharply rising initial transient wave fronts captured by such a condenser microphone, it is necessary for an amplifier system to be able to produce a speaker load current rise time that is faster than the microphone rise time, preferably about 10 microseconds or less, and ideally about 5 microseconds or less. Direct solid state pickup transducers such as those manufactured and sold by Barcus-Berry, Inc. of Huntington Beach, Calif., introduce virtually no delay into the program rise time, and where such direct transducers are employed, if the amplifier system has a rise time of not more than about 10 microseconds, and preferably not more than about 5 microseconds, the reproduction will sound completely "live" and "natural". In order to produce such rapid rise times in an amplifier/speaker combination, the speaker load current phase must be held close to "in phase" with the program signal from the 400 Hz nominal impedance point all of the way out to approximately 20 KHz, and preferably the speaker load current should be slightly leading all of the way out to approximately 20 KHz. Additionally, in order for the high frequency harmonics to be heard in their proper proportion relative to the other sound components, the attenuation of these high frequency components resulting from speaker inductive reactance must also be overcome.

Conventional state-of-the art amplifier/speaker systems are not capable of providing speaker load current with the fast rise time and substantially "in phase" condition required to avoid serious masking problems. Various attempts have been made to solve the problem, and while some of these have improved the rise time and others have improved the phasing, none have heretofore simultaneously produced a rise time on the order of 10 microseconds or less and an "in phase" or slightly leading phase condition from about 400 Hz all of the way out to about 20 KHz. A principal type of equipment that is currently employed in attempting to solve this problem is the graphic equalizer. Thus, a quality unit in the hi-fi industry is the Bose equalizer that is marketed with the Bose speaker. This unit has a frequency response curve that is actually too steep and a slightly leading phase up to around 10 KHz, going in phase between about 10 KHz and 15 KHz, but then the response curve falls off rapidly, and there is a large phase lag after 15 KHz, the lag being approximately 45° at 20 KHz. The resulting rise time is about 45 to 50 microseconds, much too slow to reproduce the high frequency harmonics in the initial transient wave front of most musical instrument sounds.

Below the 400 Hz nominal impedance point the impedance curve for a conventional speaker rises in a capacitive reactance effect caused by the compliance and open air cone resonance of the speaker. The manufacturer's speaker response curve referred to above shows the impedance to rise sharply below about 150 Hz up to a large impedance peak at 50 Hz, and then to slope back down sharply to 8 ohms at 20 Hz. This large low frequency impedance peak represents a big hole in the acoustic output of the speaker, so that much of the low frequency information in the program is lost. While some cabinet designs are effective to reduce open air cone resonance at low frequencies, they generally introduce further problems such as speaker cabinet resonances and undesired damping. Unless amplifier compensation can be provided to raise up the low frequency response all of the way down to about 20 Hz, much of the low frequency content will be lost, and particularly the low frequency information representing the percussion sounds.

In addition to the poor low frequency response of the typical speaker, the capacitive reactance effect in the region of the rising slope of the cone resonance part of the response curve below 400 Hz produces a seriously leading phase, causing fundamental and low harmonic frequencies in this region to, in effect, overtake the simultaneously phase-lagging high frequency components of the program, further compounding the "masking" problem referred to above.

The most pertinent prior art of which applicant is aware is the Crooks U.S. Pat. No. 4,260,954, issued Apr. 7, 1981 for "Amplifier Load Correction System". The load correction system of this prior patent developed feedback voltage signal representative of current through the driven load, made a comparison between such feedback signal and the amplifier input program voltage, and utilized the results of this comparison to adjust the gain of the program amplifier line to compensate for load current deviations in waveform and phase from the program. This prior system worked well when it sensed the load current of a single speaker, but attempts to employ it in connection with a load that was more complex than a single speaker, such as a plurality of speakers with crossover networks or a multiple speaker distribution line system, were not always satisfactory because the more complex load currents did not necessarily truly represent speaker performance, and the sensing could thus be masked. Another problem with direct sensing of the real load as in Crooks U.S. Pat. No. 4,260,954 was that the real load was unpredictable and often imperfect, having undesirable impedance humps and dips relative to frequency. The prior system was not capable of straightening out such irregularities. The system of U.S. Pat. No. 4,260,954 also had the difficulty that it could not be simply plugged into the amplification line; it also required additional connections to the driven load.

West German patent No. 2,235,664, published Jan. 31, 1974, was one of the references cited in said Crooks U.S. Pat. No. 4,260,954, the FIG. 2 circuit of that reference being relied upon. However, such circuit as shown and described in this German patent does not suggest use of a reference or model load to correct for the adverse effects of inductive reactance, inertia and resonances of the real speaker load. In fact, the circuit of the German patent does not in any way tend to correct for deviations of speaker load current or acoustic output from the incoming program.

Other references relied upon in said U.S. Pat. No. 4,260,954, which may be of interest relative to the present invention because of a rough general similarity in circuit appearance to circuits in one or more of the forms of the present invention are U.S. Pat. No. 3,902,111 issued Aug. 26, 1975 to Pfisterer, Jr., and U.S. Pat. No. 4,153,849 issued May 8, 1979 to Hall et al. However, these two references are considered to constitute non-analogous art, in that they are not dealing with any kind of a source of a program voltage signal that is variable as to waveform, or with the typical amplifier load such as speaker that is intended to be driven in response to such a variable waveform program voltage signal and which conventionally has a load current and power output that varies widely and generally continuously from the program voltage signal in both waveform and phase due to its high reactance, inertia, and resonances. Thus, the circuit shown and described in the Pfisterer, Jr. patent appears to be simply a low frequency servo system, with a fixed set point input and no way to put in a program voltage signal variable as to waveform, and with type and values of circuit components completely unrelated to and leading away from the present invention.

The Hall et al patent relates to a circuit for normalizing the operating characteristics of yttrium-iron-garnet (YIG) devices and traveling-wave maser (TWM) devices that are tuned by a controlled current so that such devices despite variations in individual ones can be interchanged in a microwave system without re-aligning the entire system. Again, no program signal that is variable as to waveform is applicable to the input, but there is simply a reference DC voltage which is applied to shift the response of the device to the required current-frequency characteristic for the pre-aligned overall system. The Hall et al patent discloses a positive feedback circuit arrangement having type and values of circuit components completely inapplicable to and leading away from the present invention.

SUMMARY OF THE INVENTION

In view of these and other problems in the art, it is a general object of the present invention to provide a system which substantially completely corrects for adverse characteristics of an amplifier-driven load that would otherwise cause the output of the load to deviate from the applied program, such adverse characteristics including but not being limited to electrical reactance, inertia, resonances, and the like.

Another general object of the invention is to provide an amplifier load correction system which has particular utility in audio systems, substantially completely correcting for the normally seriously distorting effects of inductive reactance, inertial lag and overshoot, and speaker compliance and associated open air cone resonance.

Another object of the invention is to provide an amplifier load correction system which is capable of so completely overcoming the usual phase lagging characteristics of a speaker which increase from the nominal or rated 400 Hz frequency all of the way out to 20 KHz caused by both inductive reactance and inertia, that for the first time in the art the speaker load current phase can be held substantially completely "in phase", and even slightly leading in phase, from 400 Hz all of the way out to 20 KHz, while simultaneously the rise time can be kept below about 10 microseconds in all forms of the invention, and within about a 2 to 5 microsecond range for several forms of the invention. Another related object of the invention is to provide an amplifier load correction system which is capable of providing a load current rise time that is sufficiently rapid and has sufficient amplitude, together with the simultaneous maintenance of a substantially completely "in phase" condition from approximately 400 Hz all of the way out to approximately 20 KHz, to enable the amplifier-speaker system to faithfully reproduce the sharply rising initial transient fronts containing most of the high frequency harmonics in musical instrument and some voice frequency sounds, and delivering this sharply rising initial transient wave front and then the midrange and low end frequencies to the ear in the correct sequential order, thereby completely overcoming transient distortion masking, and enabling the reproduced sounds for the first time to be perceived as completely "live" and "natural" in form, rather than sounding "artificial" or "recorded" as from prior art systems.

Another related object is to provide an amplifier load correction system which is capable of providing a low frequency lagging load current phase so as to compensate for the normally leading phase of a speaker in the region of the rising slope of the cone resonance part of the speaker response curve below 400 Hz, such low frequency phase compensation further assisting in the avoidance of masking of the high frequency harmonics by low frequency sound components.

Still another related object is to provide an amplifier load correction system which is capable of producing a load current rise time that is considerably faster than the 20 to 25 microsecond rise time of the typical condenser microphone, so as to make up for losses at the sound reproduction end, and at the same time reproduce the high frequency harmonic content in the sharply rising initial transient wave fronts captured by such a condenser microphone.

Another object of the invention is to provide an amplifier load correction system which, while providing fast rise time and phase corrections, at the same time corrects for the normally poor speaker impedance curve, and hence power output resonse, both in the high frequency range from 400 Hz all the way out to 20 KHz and in the low frequency range from 400 Hz all the way down to below 20 Hz.

Another, more specific object of the invention is to provide an amplifier load correction system which develops the correction signal from a reference load that serves as a model of the characteristics of the real load, such reference load being completely isolated and independent of the real driven load. A further object is to provide an amplifier load correction system which develops the correction signal from a reference load which serves as an equivalent model for the inductance of the real speaker load, and also serves as an analog model for the mechanical inertia of the speaker load, the system providing a sufficient correction amplitude to simultaneously correct for the usual adverse effects of both the inductive reactance and the inertia of the real speaker or speaker system. Similarly, it is an object to provide a reference load amplifier correction system wherein the reference load also serves as an equivalent model for the capacitance of the real speaker system load and at the same time as an analog model for the compliance and related open air cone resonance of the speaker system, to correct for these speaker characteristics.

Another object is to provide an amplifier load correction system which, by deriving its correction signal from a reference or model load instead deriving the correction signal from the real driven load, enables the correction to be based upon a substantially perfect or ideal load, so that the corrected transducer output can be a substantially perfect reproduction of the program.

A related object is to provide an amplifier load correction system which, by employing a reference or model load that is completely independent of and isolated from the real driven load, provides a correction signal that is not limited or distorted by unpredictable imperfections such as impedance humps and dips in the real load.

Still another related object is to provide an amplifier load correction system which, by employing a reference or model load independent of the real driven load, enables the correction system to be employed in connection with multiple speaker systems, such as a plurality of speakers with crossover networks or a multiple speaker distribution line system, whereas such multiple speaker systems might provide a confused basis for correction in prior systems which compare current through the real driven load with the program signal.

Another object is to provide an amplifier load correction system which is particularly easy to hook up in any amplifier-speaker system, requiring only an input jack from the preamplifier and an output jack to the power amplifier, and not requiring the additional connections to the driven load as were required in systems that sensed load current in the real driven load.

An additional object is to provide a reference load amplifier correction system of the character described wherein the reference load includes inductor and capacitor components which are scaled up to have much larger values than the corresponding inductance and capacitance characteristics of the real driven load represented by the reference load, to minimize current through the reference load and hence power required to drive the reference load.

According to the invention, program signal is applied to a reference load having both inductor and capacitor components so as to develop respective high and low frequency correction signal components. These inductor and capacitor components of the reference load are preferably tuned to cancel and provide zero correction signal from the system at approximately the 400 Hz nominal impedance frequency of most speakers and speaker systems, the inductor component of the reference load developing a high frequency correction signal for frequencies from approximately 400 Hz all of the way out to approximately 20 KHz, and the capacitor component of the reference load developing a low frequency correction signal for frequencies from approximately 400 Hz down to below about 20 Hz.

In some forms of the invention the reference load is a single series-tuned inductor-capacitor circuit from which the high and low frequency correction signal components are developed together. In other forms of the invention separate high and low frequency channels are employed, the high frequency channel containing the inductor reference load component and the low frequency channel containing the capacitor reference load component. The correction signal outputs of the high and low frequency channels are mixed with the program signal in a summing amplifier for delivery to the power amplifier that drives the real load. This use of separate high and low frequency correction signal channels, with a further independent program signal channel, enables the amplitudes of the high and low frequencies to be independently adjusted relative to the program signal and each other, so that the signals may be delivered in optimum relative proportions to the power amplifier driving the real load.

In another form of the invention, adjustment of the correction signal relative to the program signal is provided for by having two channels, the correction signal containing both high and low frequency correction components being developed in one channel in which the program signal is cancelled so that the correction signal can be independently adjusted, and the other channel being a direct program signal channel. The adjusted correction signal and the program signal are mixed in a summing amplifier for delivery to the power amplifier that drives the real load.

In some forms of the invention, current through the reference load is sensed and a voltage feedback signal representative of reference load current is compared with the program signal voltage in a differential operational amplifier (or in separate differential operational amplifiers if separate high and low frequency correction channels are employed) to develop the correction signal that is to be delivered to the power amplifier along with the program signal. In other forms of the invention, the inductor component of the reference load is arranged, and preferably each of the inductor and capacitor components of the reference load is arranged in a separate channel voltage divider network from which the correction signal component is derived; and the correction signals, which are independently adjustable, are mixed with the program signal in a summing amplifier for delivery to the power amplifier that drives the real load.

BRIEF DESCRIPTION OF THE DRAWINGS

These and other objects of the invention will become more apparent in view of the following description taken in conjunction with the drawings, wherein:

FIG. 1 is a circuit diagram showing a first form of the invention in which the reference load is a single series-tuned inductor-capacitor circuit, and a feedback signal representing reference load current is compared with incoming progam signal in a differential operational amplifier connected as a current amplifier;

FIG. 2 is a circuit diagram showing a second form of the invention which is similar to the form shown in FIG. 1, but has the differential operational amplifier arranged as a voltage amplifier;

FIG. 3 is a circuit diagram showing a third form of the invention which is similar to the forms shown in FIGS. 1 and 2, but which makes the comparison between the feedback voltage and the program signal voltage in a separate comparator rather than in a line differential operational amplifier;

FIG. 6 is a circuit diagram illustrating a sixth form of the invention also having separate channels, but in which the high frequency channel correction signal is developed in a divider network containing an active inductor;

FIG. 7 is a circuit diagram illustrating a seventh form of the invention which has separate high and low frequency channels in which the respective high and low frequency correction signals are derived from voltage dividers containing the respective inductor and capacitor reference load components;

DETAILED DESCRIPTION

Figure 4:
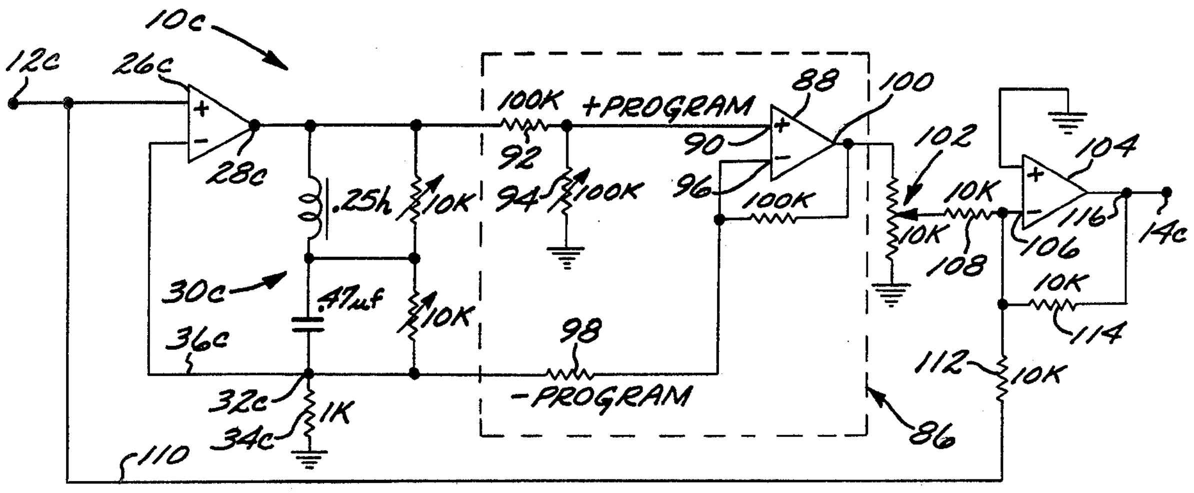
FIG. 4 is a circuit diagram illustrating a fourth form of the invention wherein the correction signal is developed in a circuit similar to that of FIG. 2, and separated out of the program signal for independent adjustment, and is then re-united with the program signal in a summing amplifier.

Referring to the drawings, FIG. 1 is a circuit diagram illustrating a first form of the reference load amplifier correction circuit or system of the present invention. The reference load correction circuit shown in FIG. 1 is illustrated in operative association with a power amplifier and speaker load which may be any existing, conventional state-of-the-art power amplifier and speaker components. Although such power amplifier and associated load are not shown in the other circuit forms of the invention illustrated in FIGS. 2–7, it is to be understood that the power amplifier and load will be connected to the output terminals of each of the other circuit forms of the invention shown in FIGS. 2–7 in the same manner as in the circuit form of FIG. 1.

The reference load correction circuit or system shown in FIG. 1 is generally designated 10, and includes input and output terminals 12 and 14, respectively. Input terminal 12 is electrically connected to a program source, which will generally include a conventional state-of-the-art preamplifier. The correction circuit output terminal 14 is connected to the input terminal 16 of power amplifier 18 which may be a conventional state-of-the-art power gain block. To assure that adequate amplifier power is available for the reference load correction circuit 10 of the invention to substantially completely conform the output of the load transducer to the waveform and phase of the program input to correction circuit 10, over a wide frequency band, it is preferred that the power amplifier 18 have a power gain of at least approximately 20. Additionally, in order to assure that the power amplifier does not introduce any material waveform distortion, it is preferred that its frequency response be substantially flat (in the constant voltage mode) from approximately 20 Hz to approximately 20 KHz.

While the reference load correction circuit 10 of the invention will normally be connected between a preamplifier and a power amplifier, it is to be understood that it may be disposed at any location in the line of components from the program source to the power amplifier.

While the reference load correction circuit of the present invention is capable of correcting for the defects or deficiencies of any amplifier-driven load, the typical load will be a speaker load such as that found in a hi-fi, television or radio set. The speaker load may be a single speaker such as the speaker 20 diagrammatically illustrated in FIG. 1, or may consist of multiple speakers with crossover networks. The reference load correction circuit of the invention is also suitable for load correction in a multiple-channel amplifier system where the channels are bridged together for a monaural output of multiplied power. The reference load correction circuit of the invention is also available for load correction in a distribution line system (e.g., 70 volts) to a number of speakers, as sometimes employed in theaters. In all multiple speaker systems where the reference load correction circuit of the invention is employed, the circuit of the invention will substantially completely correct for both the electrical (reactance) and mechanical (inertial) deficiencies of each of the plurality of speakers in the system.

The program signal that is furnished to the correction circuit input terminal 12 is a voltage signal that is variable as to waveform according to the music, voice or other program information which it contains. Under conventional circumstances, without the presence of the reference load correction circuit or system 10 of the invention, after amplification in the constant voltage power amplifier 18 this variable waveform program signal would be subjected to severe amplitude and phase distortions by the high inductive reactance, the mechanical inertia, and the open air cone resonance of the speaker device load 20, as discussed in detail hereinafter in connection with the load correction characteristics of the invention.

The input program signal is conducted from input terminal 12 through a conductor 22 to the non-inverting input 24 of a balanced differential operational amplifier 24. The output 28 of operational amplifier 26 is connected to the correction circuit output terminal 14, and also to one side of the reference load of the invention which is generally designated 30. The other side of reference load 30 is connected to a sensing point 32 and thence through a sensing resistor 34 to ground. The sensing resistor 34 senses current flow through the reference load 30 and thus develops a feedback voltage signal at sensing point 32. This feedback voltage signal is conducted through a conductor 36 back to the inverting input 38 of the differential operational amplifier 26.

The reference load 30 consists of an inductor 40 and a capacitor 42 which are in series. The inductor 40 causes a phase lag of the current through reference load 30 relative to the phase of the program signal at input terminal 12 and operational amplifier output 28; while the capacitor 42 causes a phase lead of the current through reference load 30 relative to the program voltage signal at input terminal 12 and operational amplifier output 28. The values of inductor 40 and capacitor 42 are preferably chosen so that the reference load circuit 30 is series-tuned at approximately 400 Hz, so as to conform the reference load correction circuit 10 to the usual 400 Hz nominal or rated impedance point of speaker systems. By referring to the reference load circuit 30 as being tuned to approximately 400 Hz, it is meant that the reactances of inductor 40 and capacitor 42 cancel at that frequency; i.e., the phase shifting effects of inductor 40 and capacitor 42 cancel at that frequency. Thus the only impedance left in the reference load circuit is the resistance of the inductor 40, which is quite low.

The input from input terminal 12 to the noninverting input 24 of differential operational amplifier 26 includes an input network consisting of a pair of resistors 44 and 46 which are equal in value. Similarly, the feedback circuit from sensing point 32 to the inverting input 38 of operational amplifier 26 includes a feedback network consisting of a pair of resistors 48 and 50 which are equal in value to each other and also to each of the input network resistors 44 and 46. These equal values of the input network resistors and feedback network resistors cause the differential operational amplifier 26 to have unity transfer gain for a 400 Hz program signal, for which the load current through the reference load 30 will have its maximum value, or will in effect go straight through the reference load 30, and the feedback voltage signal at sensing point 32 will likewise have a maximum value above ground. With this unity transfer gain of differential operational amplifier 26, it will not introduce any detectable residual background noise into the amplification line, which was a problem in some prior systems.

Because the two differential inputs of the operational amplifier 26 are being continuously fed the respective program and feedback signals through the respective conductors 22 and 36, the differential operational amplifier 26 is continuously comparing the current through the reference load 30 with the input program voltage as to both amplitude and phase, to continuously produce a correction signal in addition to the amplified program signal at the operational amplifier output 28. This correction signal continuously and instantaneously corrects for both the phase shifts and reactance value changes in both the inductor 40 and the capacitor 42 which result from variations of the program frequency from 400 $H_z$, no matter how wide such variations may be within the bandwidth of the correction circuit 10. This correction is so complete and so instantaneous for both phase and amplitude that the sensing point 32 is established as a rock solid constant current point representative of minus program voltage.

As program signal frequency components go up from the 400 $H_z$ series-tuned value of the reference load 30, the corresponding increased reactance of the reference load inductor 40 causes a reduced current through sensing resistor 34, a corresponding reduced feedback voltage level at sensing point 2, and a corresponding increased correction signal component of the output 28 of differential operational amplifier 26. Similarly, below the 400 $H_z$ tuned value of reference load 30 the increased reactance of the reference load capacitor 42 will increase the value of the correction signal component of the output 28 of differential operational amplifier 26. The result is that a plot of correction signal amplitude vs. frequency produces a curve similar to a conventional speaker reactance curve.

Figure 8:
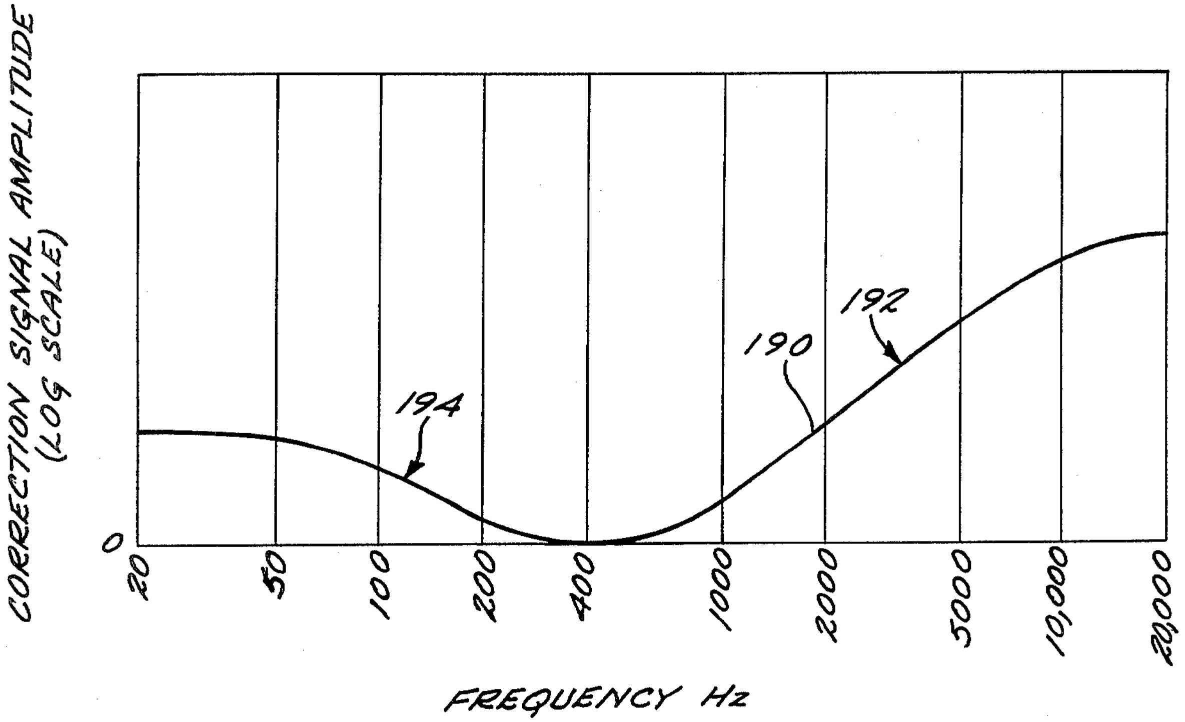
FIG. 8 is a correction signal amplitude vs. frequency curve for the correction signal of the present invention from 20 Hz to 20 KHz.
Figure 9:
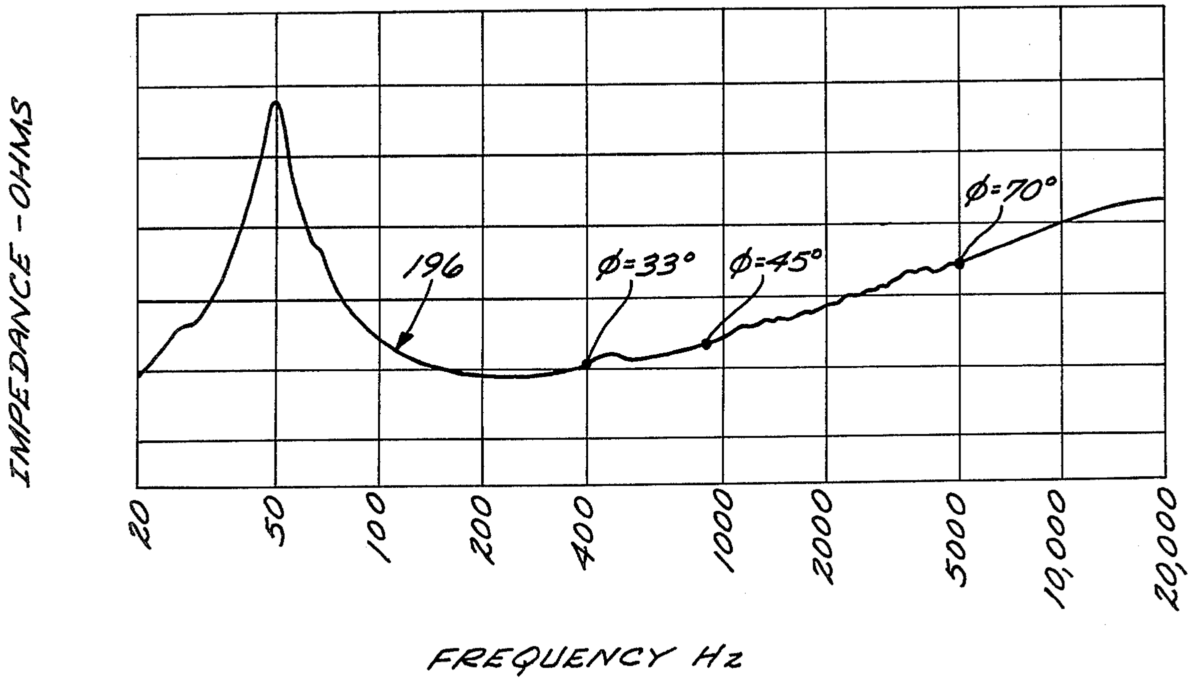
FIG. 9 shows a total impedance vs. frequency response curve for a typical speaker that is rated 8 ohms at 400 Hz.

Such a curve for the correction signal is shown in FIG. 8 and for speaker reactance is shown in FIG. 9, and these curves will be discussed more in detail hereinafter. Resistors 52 and 54 are connected in parallel with the respective reference load inductor 40 and capacitor 42. Adjustment of these resistors 52 and 54 sets the upper limits of the respective reactances 40 and 42, and correspondingly the upper limits of the correction signal amplitude vs. frequency curve proximate the respective upper and lower frequency ends of the bandwidth of the correction circuit 10. The value selected for the sensing resistor 34 determines the slope of the correction signal curve.

It is to be noted that not only is the correction signal component at the output 28 of operational amplifier 26 fed to the reference load 30, but it is at the same time fed to the correction circuit output terminal 14 and thence to the input terminal 16 of power amplifier 18 right along with the program signal. Amplification of the correction signal in power amplifier 18 provides the correction signal with the required power to substantially completely correct for amplitude and phase distortions that would otherwise be caused by the inductive reactance and cone resonance of the speaker or speaker system and mechanical distortions that would otherwise be caused by the inertia of the speaker and particularly by the mass of a magnetic speaker coil.

While the load 30 employed to develop the correction signal has heretofore been referred to as a reference load, it may also suitably be referred to as a synthetic load, a phantom load, an equivalent load, a simulated load, a model load, or an artificial load.

While the inductor 40 and capacitor 42 components of reference load 30 have relative values that approximately represent a typical speaker system load, such values are preferably scaled upwardly many times above the corresponding values in an actual speaker system, and this allows the current-sensing resistor 34 to be correspondingly scaled up in value. Such higher values of the circuit components of reference load 30 and of sensing resistor 34 permit the differential operational amplifier 26, which is a power amplifier in the FIG. 1 form of the invention, to be a low power amplifier chip. Nevertheless, since the inductor 40 and capacitor 42 components of reference load 30 are in correct proportions to represent a true speaker system load, the correction signal that is developed by the reference load 30 will be compatible with any speaker load system so as to substantially completely correct for the electrical and mechanical deficiencies of the speaker system.

The reference load correction circuit 10 of FIG. 1 is a current-operated system, and it therefore has a high output impedance which requires a load above approximately 10 K (10,000 ohms). This can be overcome by changing the circuit to a voltage amplifier as shown in FIG. 2, which reduces the load requirement to approximately 2 K (2,000 ohms).

The reference load correction circuit shown in FIG. 2 is generally designated 10*a*, and differs from the circuit of FIG. 1 principally in the elimination of the two feedback network resistors. The input network resistors of the FIG. 1 form may be included if desired, but are not required. Otherwise, the circuit components of the voltage amplifier form of the invention shown in FIG. 2 may be the same as the circuit components of the current amplifier form of FIG. 1. Thus the program signal is introduced at input terminal 12*a* and conducted through conductor 22*a* to the non-inverting input 24*a* of balanced differential operational amplifier 26*a*. The output 28*a* of operational amplifier 26*a* is connected both to the output terminal 14*a* of circuit 10*a* as the input to a power amplifier driving the real load, and to one side of the reference load generally designated 30*a*. Reference load 30*a* includes series-connected inductor 40*a* and capacitor 42*a* which may have the same values as the corresponding circuit components in FIG. 1 and are series-tuned at approximately 400 $H_z$; and the reference load 30*a* also includes respective adjustable shunt resistors 52*a* and 54*a* across inductor 40*a* and capacitor 42*a* which serve the same purpose as the corresponding circuit components in FIG. 1. The other side of reference load 30*a* is connected to sensing point 32*a* which is connected to sensing resistor 34*a* and also, through conductor 36*a*, to the inverting input 38*a* of differential operational amplifier 26*a*. Except for being in the form of a voltage amplifier with its reduced output load requirement, instead of a current amplifier, the reference load correction circuit 10*a* shown in FIG. 2 operates the same as the reference load correction circuit 10 shown in FIG. 1, and produces the same results. It is to be noted that each of the respective differential operational amplifiers 26 and 26*a* of FIGS. 1 and 2 is arranged without voltage feedback as a variable gain amplifier so as to enable it to produce the continually varying correction signal of the invention.

Most musical instrument sounds have a sharp attack characterized by a sharply rising initial transient wave front containing most of the high frequency harmonics of the sound, such sharply rising wave fronts being produced at a repetitive rate according to the fundamental frequency of the sound. In order for the human ear to hear the entire spectrum of such sounds, it must receive the upper partials first, and then the heavier fundamental sounds; when received in this order, all of the sound components are heard and are perceived as being completely "natural" in form, rather than sounding "artificial" or "recorded" as most processed sounds heretofore have been perceived. A principal problem with prior art amplifier/speaker systems is that the reactance and mechanical inertia of the speaker system prevents the speaker or speakers from accelerating rapidly enough at the onset of each cycle of the fundamental frequency to reproduce the sharply rising wave fronts or initial transients which contain most of the high frequency harmonics before the midrange and low end frequencies are reproduced by the speaker or speakers, which results in the high frequency harmonics being masked to a large extent by the lower, heavier frequencies. Typically, such masking can result in a total loss of up to about 50% of the high frequency harmonic content of the sound. Thus, with conventional amplifier/speaker systems, the "tinkly" sounds of bells, chimes and the like which add so much to the reality of music virtually disappear. Even the timbre of a voice is changed relative to the vowel sounds if subjected to such speaker distortion influences. This masking of the high frequency harmonic content of sounds in prior art systems is commonly referred to as "transient distortion", and has heretofore been simply accepted in the art as an inherent deficiency in amplifier/speaker systems.

To substantially completely cure this transient distortion problem, the amplifier must be capable of driving the speaker system in an acoustic rise time of no more than approximately 10 microseconds and with substantially zero phase lag from the 400 $H_z$ crossover frequency all the way up to approximately 20 $KH_z$. The term "rise time" as employed herein refers to the time duration of the initial, rising quarter of a full sine wave cycle. Thus, a 10 microsecond rise time is equivalent to a frequency of 25 $KH_z$.

Experimental prototypes of the reference load correction circuits 10 and 10*a* of FIGS. 1 and 2, respectively, exhibit rise times between about 5 and 10 microseconds, so that these circuits have a bandwidth ranging from about 50 $KH_z$ to about 25 $KH_z$. This sharp rise time in the range of from about 5 to about 10 microseconds enables the reference load correction circuits of FIGS. 1 and 2 to make a full phase correction in the load up to approximately 10 $KH_z$, and to hold the load close to in phase up to around 20 $KH_z$, although in some cases the circuits of FIGS. 1 and 2 appeared to allow a slight phase lag at 20 $KH_z$. It is preferable, however, for the correction circuit to produce a slightly leading or anticipatory phase from the 400 $H_z$ crossover frequency all of the way up through the high end of the frequency spectrum, including 20 $KH_z$. This requires a rise time that is no longer than about 5 microseconds, and preferably between about 2 and about 5 microseconds. Such a slight leading phase assures that the actual acoustic output of the speaker system will be at least in phase, and thereby assures the correct order of reproduction by the speaker system of the upper partials first, and then heavier lower harmonics and fundamental sounds.

Although for most speaker systems the load correction provided by the circuits of FIGS. 1 and 2 has proven to be excellent, there appears to be a practical limitation on the amount of correction that is available from these circuits in the higher frequencies. This is evidenced by the fact that when the variable resistor 52 (or 52*a*) which shunts the inductor 40 (or 40*a*) in the reference load 30 (or 30*a*) is turned up to raise the Q of the inductor circuit to a high value, both rise time and phase correction appear to become slightly impaired, and also an unnatural brightness appears to be introduced into some types of sound.

Another minor problem with the reference load correction circuits of FIGS. 1 and 2 is that they exhibit a harmonic distortion at full output on the order of approximately 0.8%. It is nevertheless questionable as to whether or not the rise time, phase and harmonic distortion limitations of the circuits of FIGS. 1 and 2 would be audible to the average listener.

Figure 5:
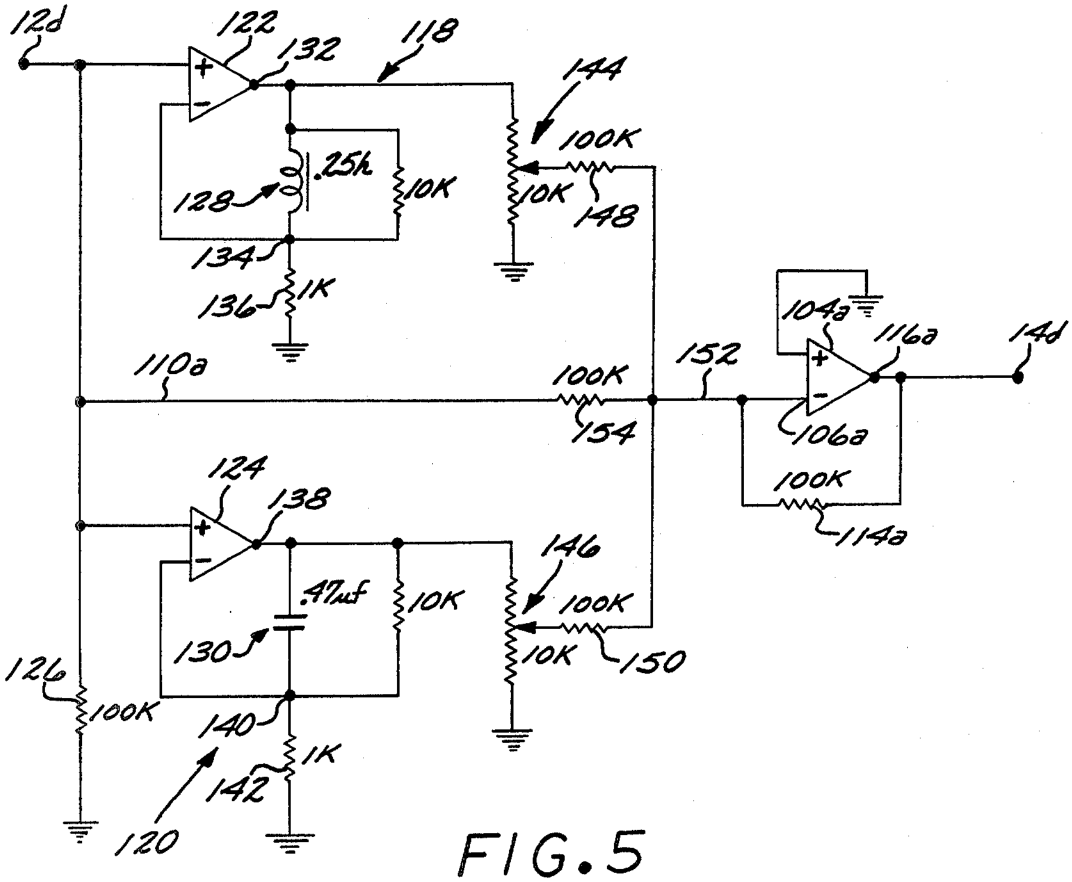
FIG. 5 is a circuit diagram illustrating a fifth form of the invention in which separate high and low frequency channels contain respective separate inductor and capacitor reference load components.

The reference load correction circuit or system disclosed in FIG. 4 provides for separating the correction signal out from the program signal so that the correction signal may be amplified to any desired extent relative to the program signal, and then mixing the correction signal back in with the program signal; while the load correction circuits or systems of FIGS. 5–7 provide separate circuit portions for the high and low frequency load correction above and below the 400 $H_z$ crossover frequency. These features of the correction circuits of FIGS. 4–7 enable the amount of the correction of the higher frequencies to be adjusted to shorten the rise time to within a range of from about 2 to about 5 microseconds, to provide a slightly leading phase from a little above the crossover frequency of 400 $H_z$ up to the top end of the spectrum at about 20 $KH_z$, and enables the correction signal to be sufficiently powerful to substantially completely overcome both speaker reactance and speaker inertia.

Before describing the details of the circuit of FIGS. 4–7, a third form of reference load correction circuit, shown in FIG. 3, that is similar to the correction circuits of FIGS. 1 and 2, will be described. In this circuit, which is generally designated 10*b*, the program applied to input terminal 12*b* passes through an input resistor network consisting of resistors 44*b* and 46*b* to the non-inverting input of balanced variable gain differential operational amplifier 26*b* which has an output 28*b* at which appears both the program voltage signal and the correction voltage signal. Operational amplifier 26*b* has a conventional feedback resistor 56 connected between its output 28*b* and its inverting input 38*b*. The mixed program signal and correction signal are fed from the operational amplifier output 28*b* to the output terminal 14*b* of correction circuit 10*b*, the circuit output terminal 14*b* being adapted for connection to the input of a power amplifier which drives the main load in the same manner as in FIG. 1. The circuit of FIG. 3 is also similar to that of FIG. 1 in that a low power, current amplifier chip is employed, but in FIG. 3 this is a separate operational amplifier 68 that is employed for driving the reference load 30*b*. Amplifier 58 receives at its non-inverting input 60 the same mixed program and correction signal from differential amplifier output 28*b* as is fed to the system output 14*b*. Low power amplifier 58 includes an input resistor 62 and a feedback network consisting of resistors 64 and 66. The output 68 of amplifier 58 is connected to one side of the reference load 30*b*, the other side of which is connected to sensing point 32*b*. Sensing resistor 34*b* connected between sensing point 32*b* and ground develops a feedback voltage signal representative of reference load current. The reference load 30*b* and its current-sensing resistor 34*b* may be the same as the corresponding circuit components of the circuits shown in FIGS. 1 and 2, serving to provide a similar voltage feedback signal.

The principal difference between the system of FIG. 3 and those of FIGS. 1 and 2 is that the load correction signal in the system of FIG. 3 is not developed in a differential amplifier that is in the program signal line, but instead is developed in a separate differential comparator 70 which is a balanced differential operational amplifier similar to the differential operational amplifier 26*b*. The feedback voltage signal developed across sensing resistor 34*b* is fed to the non-inverting input 72 of differential comparator 70 through an input network consisting of resistors 74 and 76. Thus, the non-inverting input 72 of differential comparator 70 receives a feedback voltage signal that continuously represents both the amplitude and the phase of the reference load current. The inverting input 78 of differential comparator is connected through an input network consisting of resistors 80 and 82 to the program input terminal 12*b* so that the inverting input 78 continuously receives a voltage signal representing the incoming program. The differential comparator 70 thus produces the desired correction voltage signal at its output 84 that represents a continuous, instantaneous differential comparison between the program and feedback voltages. The correction voltage signal is applied from comparator output 84 to the inverting input 38*b* of variable gain differential line amplifier **26*b* so as to mix the correction voltage signal with the program voltage signal at the output 28*b* of amplifier 26*b* and at the system output 14*b***.

Referring now to FIG. 4, the reference load correction circuit **10*c* shown in this figure includes the same circuit components as the reference load correction circuit 10*a* shown in FIG. 2 for initially developing the correction signal voltage admixed with the program signal voltage. Thus, the program provided at input terminal 12*c* is delivered to the non-inverting input of balanced differential operational amplifier 26*c*, the output 28*c* of which is connected to one side of reference load 30*c* that is a series-tuned inductor-capacitor circuit. The other side of reference load 30*c* is, like in FIG. 2, connected to sensing point 32*c* reference load current passing from sensing point 32*c* through sensing resistor 34*c* to develop the current-representative feedback signal, this feedback signal being delivered through conductor 36*c* back to the inverting input of differential operational amplifier 26*c***.

The reference load correction circuit **10*c* of FIG. 4 includes a program signal cancellation circuit generally designated 86 which, for convenience, is shown outlined or enclosed in dotted lines. The cancellation circuit 86 includes a balanced differential operational amplifier 88 which receives positive program signal plus the correction voltages at its non-inverting input 90 from the output 28*c* of differential amplifier 26*c* through an input network consisting of a fixed resistor 92 and a variable resistor 94. The inverting input 96 of differential amplifier 88 receives negative program voltage from the sensing point 32*c* through an input resistor 98. The variable resistor 94 is adjusted to zero at 400 $H_z$ the balanced differential amplifier 88 at its output 100, leaving only the correction voltages at the output 100; i.e., leaving only the high slope and low slope respectively above and below 400 $H_z$, or the correction areas, of the correction signal amplitude vs. frequency curve shown in FIG. 8. This separated correction signal is mixed back into the main program through a gain control potentiometer 102 into a summing amplifier 104. Both the correction signal and the program signal are introduced into summing amplifier 104 at its inverting input 106, the correction signal being introduced through an input resistor 108, while the program signal bypasses both the reference load correction circuit 10*c* and the program signal cancellation circuit 86, being conducted directly from program input terminal 12*c* through conductor 110 and input resistor 112. Summing amplifier 104 has a feedback resistor 114 between its output 116 and input 106. The output 116 of summing amplifier 104 is then connected to the output terminal 14*c*** of the system, which in turn is adapted for connection to a power amplifier and real load combination.

The correction signal separation type correction circuit of FIG. 4 has several advantages over the reference load correction circuits of FIGS. 1, 2 and 3. It has an improved rise time of approximately 3 microseconds. The correction signal produced in the circuit of FIG. 4 will cause the load current through the real load to have the desired slight leading phase from proximate the 400 $H_z$ crossover frequency all of the way up to 20 $KH_z$, thus providing the desired anticipatory phase that assures that the actual acoustic output of the speaker system will be at least in phase and will reproduce the upper partials and then the lower harmonics and fundamental frequency in the correct order. An important advantage of the circuit of FIG. 4 over those of FIGS. 1–3 is that the correction adjustment does not change the rise time or phase. This enables a greater amount of correction to be provided by the circuit of FIG. 4. It has been found that the Q of the inductor circuit portion of reference load **30*c* in FIG. 4 can be taken up to approximately double the value of the Q in the circuits of FIGS. 1–3. Even if the upper frequency correction is turned way up in the circuit of FIG. 4, the acoustic output of the real load does not become unnaturally brighter or shriller, but still accurately represents voice timbre, and high harmonic-containing tinkly sounds of such instruments as bells, chimes and cymbals. The circuit of FIG. 4 has the still further important advantage that the output of its summing amplifier 104 is not load-sensitive. The harmonic distortion for the circuit of FIG. 4 is approximately the same as for the circuits of FIGS. 1–3**.

Referring now to FIG. 5, the reference load correction system shown in this figure includes separate high frequency and low frequency reference load correction circuit portions 118 and 120, respectively, each of which has its own respective balanced differential operational amplifier 122 and 124. The program input terminal **12*d* is connected, through input resistor 126, to the non-inverting input of each of the differential amplifiers 122 and 124. The high frequency differential amplifier 122 uses an inductor reference load 128 and the low frequency differential amplifier 124 uses a capacitor reference load 130, with the crossover frequency for the reference loads 128 and 130 still at 400 $H_z$. The output 132 of amplifier 122 is connected to one side of the inductor reference load 128, while the other side of reference load 128 is connected to sensing point 134 which is in turn connected both to sensing resistor 136 and to the inverting input of amplifier 122. Similarly, the output 138 of amplifier 124 is connected to one side of the capacitor reference load 130, the other side of which is connected to sensing point 140, the sensing point 140 in turn being connected to sensing resistor 142 and to the inverting input of amplifier 124**.

Separate high and low frequency correction signals are provided at the respective amplifier outputs 132 and 138, and these are mixed through respective individual gain control potentiometers 144 and 146 with the original program into a summing amplifier **104*a*. The outputs of the respective high and low frequency correction signal gain control potentiometers 144 and 146 are connected through respective summing resistors 148 and 150 to a summing bus 152 that is connected to the inverting input 106*a* of summing amplifier 104*a*. Flat, full, undistorted program signal is conducted from program input terminal 12*d* through a conductor 110*a* and summing resistor 154 to the summing bus 152. Thus, the separately adjustable high and low frequency correction signals are mixed with the original program signal in the summing bus 152 and summing amplifier 104*a*. Preferably, the feedback resistor 114*a* that is connected between the output 116*a* and inverting input of summing amplifier 104*a* has the same value as each of the summing resistors 148, 150 and 154 for a one-to-one gain for each of the mixed signals. The output 116*a* of summing amplifier 104*a* is connected to the system output 14*d***, which in turn is adapted to be connected to a power amplifier and load combination.

The circuit of FIG. 5, while containing the desirable feature of independent adjustability of the high and low frequency corrections, has the rapid rise time and slightly leading phase all the way out to 20 $KH_z$ of the circuit of FIG. 4. Correction adjustment in the circuit of FIG. 5 has been found to not change the phase or rise time. The harmonic distortion is reduced to approximately 0.4%, which is only about half that of the previously described circuits.

The form of the invention illustrated in FIG. 6 has, like the form of FIG. 5, three separate channels, high and low frequency correction channels and a straight-through program signal channel. In the form of FIG. 6, the low frequency correction channel and the program signal channel are the same as in the circuit of FIG. 5, but the high frequency channel employs an "active inductor" in a voltage divider circuit arrangement that produces the high frequency amplitude and phase correction signal without requiring the preparation of a feedback signal or the comparison of such a feedback signal with the incoming program signal as required for the high frequency correction in the previously described forms of the invention.

In FIG. 6, the program voltage signal is introduced at program input terminal 12*e* and is fed to separate high and low frequency reference load correction circuit portions 118*a* and 120*a* respectively. As in the FIG. 5 form of the invention, the low frequency correction circuit portion 120*a* includes a balanced differential operational amplifier 124*a* which drives a capacitor reference load 130*a* to develop the required low frequency voltage feedback signal across sensing resistor 142*a* and deliver this feedback voltage signal to the inverting input of the differential amplifier 124*a*. The low frequency correction signal is delivered from the output of differential amplifier 124*a* through gain control potentiometer 146*a* and summing resistor 150*a* to summing bus 152*a*.

As for the circuit of FIG. 5, the flat, unattenuated program voltage signal is delivered from program input terminal 12*e* through conductor 110*b* and summing resistor 154*a* to the summing bus 152*a*.

The high frequency reference load correction circuit portion 118*a* in the FIG. 6 form of the invention utilizes an active inductor in a voltage divider circuit arrangement that produces a high frequency correction signal that is essentially the same as the high frequency correction signal produced in the FIG. 5 form of the invention, but is produced without the FIG. 5 feedback and comparison with the incoming program signal. The active inductor is shown enclosed in the dotted line block and is generally designated 156. A conventional inductor could be employed in the same circuit position as the active inductor 156 in FIG. 6, but the active inductor is preferred because it functions as a perfect inductor that has no resistance. The active inductor 156 is a type of circuit well known in the art, so that the detailed operation of its individual parts does not form a part of the present invention. It includes back-to-back differential operational amplifiers 158 and 160, the amplifier 160 having phase shifting networks 162 and 164 associated with its respective inverting and non-inverting inputs; the phase shifting network 162 consisting of a resistor 166 and capacitor 168, and the phase shifting network 164 consisting of a capacitor 170 and resistor 172. The active inductor amplifier 160 has an output resistor 174.

The voltage divider of which the active inductor 156 is a part includes a resistor 176 as the upper part of the voltage divider, the resistor 176 being connected at its upper end to program input terminal 12*e* and at its lower end to the active inductor 156 at a junction 178. The active inductor 156 is the lower part of the voltage divider, extending from the junction 178 to a ground connection 180. The output from this voltage divider consisting of resistor 176 and active inductor 156 is taken from a junction 182 at the output of amplifier 158. The output point 182 will correspond in amplitude and phase to the voltage divider junction point 178, because the amplifier 158 is arranged as a unity gain voltage follower.

The amount of high frequency correction is made adjustable by being taken off of the junction point 182 through gain control potentiometer 144*a*, and the high frequency correction signal is delivered through a summing resistor 148*a* to the summing bus 152*a*. The summing bus 152*a* delivers the high and low frequency correction signals and the program signal to summing amplifier 104*b*, the output 116*b* of which is connected to the system output terminal 14*e* that is adapted to be connected to a power amplifier and load combination.

The gain on any one of the three channels in the summing amplifier 104*b* is the value of the amplifier feedback resistor 114*b* divided by the value of the respective channel summing resistor 148*a* (for the high frequency channel), 150*a* (for the low frequency channel), and 154*a* (for the program channel). Inasmuch as the voltage divider arrangement of the high frequency channel causes its correction signal to be considerably lower in amplitude than the correction signal of the low frequency and program channels, the summing resistor 148*a* for the high frequency channel has a much lower value than the summing resistors for the low frequency and program signal channels, as for example in a ratio of one to ten, so as to provide a balanced output between the three channels.

The active inductor high frequency channel reference load operates in the following manner to provide the high frequency correction signal: At the 400 $H_z$ crossover frequency, the active inductor 156 of the high frequency channel 118*a* and the capacitor reference load 130*a* of the low frequency channel 120*a* balance so as to cancel. As program frequency rises above the 400 $H_z$ crossover frequency, the active inductor 156 increases more and more in impedance, so that it occupies an increasingly larger proportion of the voltage drop in the voltage divider arrangement with resistor 176, to produce an increasingly higher correction signal voltage output at the junction point 182 and hence through the gain control potentiometer 144*a* and summing resistor 148*a* to the summing bus 152*a* and summing amplifier 104*b*. The continuous, instantaneous nature of the correction signal, with its fast rise time that is faster than the audible harmonics, causes the high frequency correction signal output from the voltage divider output junction point 182 to have a slightly leading phase relative to the program signal all of the way up from the 400 $H_z$ crossover frequency to 20 $KH_z$. The high frequency correction signal is, essentially, the continuous, instantaneous complement of the active inductor impedance as to both amplitude and phase.

The reference load correction circuit of FIG. 6 has exhibited a much lower harmonic distortion than the previously described correction circuits, on the order of 0.1%, improved rise time of from about 2 to about 3 microseconds, and does not cause any change in phase correction or rise time with adjustments of the amount of correction in the respective high and low frequency channels 118*a* and 120*a*.

In the reference load correction system illustrated in FIG. 7, separate high and low frequency channels 118*b* and 120*b* are employed as they are in the systems of FIGS. 5 and 6, but the reference loads for the separate high and low frequency channels are each arranged in a voltage divider configuration similar to the high frequency channel voltage divider configuration of FIG. 6. If desired, the high frequency correction channel 118*b* of the FIG. 7 system can be made identical to the high frequency correction channel 118*a* of FIG. 6, employing the active inductor 156 of FIG. 6; however, to illustrate the high frequency channel inductor voltage divider arrangement in a simpler form, a real inductor 156*a* has been shown in FIG. 7 instead of the active inductor 156.

The high frequency channel voltage divider in FIG. 7 consists of resistor 176*a* and inductor 156*a* connected between program input terminal 12*f* and ground. The high frequency correction signal output is from the junction 178*a* between the voltage divider components 176*a* and 156*a*, and is fed through gain control potentiometer 144*b* and summing resistor 148*b* to summing bus 152*b* and thence to summing amplifier 104*c*. This high frequency correction channel 118*b* of FIG. 7 operates in exactly the same way as the high frequency correction channel 118*a* of FIG. 6.

The low frequency correction channel 120*b* of FIG. 7 includes a voltage divider between program input terminal 12*f* and ground consisting of a resistor 184 and a reference load capacitor 186. The output junction 188 from this reference load divider provides its low frequency correction signal through gain control potentiometer 146*b* and summing resistor 150*b* to summing bus 152*b* and thence to summing amplifier 104*c*.

The flat, unattenuated program signal is delivered from program input terminal 12*f* through conductor 110*c* and summing resistor 154*b* to summing bus 152*b* and thence to summing amplifier 104*c*. The mixed high and low frequency correction signals and program signal are delivered from the output 116*c* of summing amplifier 104*c* to the system output 14*f* which is adapted to be connected to a power amplifier and load combination.

Because of attenuation in the voltage dividers of both the high frequency correction channel 118*b* and the low frequency correction channel 120*b*, the respective summing resistors 148*b* and 150*b* for the high and low frequency channels are made much smaller than the feedback resistor 114*c* in summing amplifier 104*c* and the summing resistor 154*b* in the program channel conductor 110*c*. This causes the correction signals from both the high frequency correction channel 118*b* and the low frequency correction channel 120*b* to be amplified to correct proportions relative to the program signal.

The reference load inductor 156*a* in high frequency correction channel 118*b* and the reference load capacitor 186 in the low frequency correction channel 120*b* are balanced to cancel at the 400 $H_z$ crossover frequency. The capacitor reference load voltage divider in the low frequency channel 120*b* operates in the same manner as the inductor reference load voltage dividers in the high frequency channels of both FIG. 6 and FIG. 7, except that it operates in the opposite direction for frequency reductions below 400 $H_z$. Thus, as the frequency drops below 400 $H_z$, the impedance of reference load capacitor 186 increases, so that the proportion of voltage drop across capacitor 186 increases relative to the overall voltage drop across the divider that includes resistor 184 and capacitor 186; resulting in increased correction signal output delivered from the voltage divider junction 188 to gain control potentiometer 146*b* and thence through summing resistor 150*b* and summing bus 152 to summing amplifier 104*c*. The low frequency correction signal produced at the voltage divider junction 188 is, essentially, the continuous, instantaneous complement of the impedance of capacitor 186 as this impedance varies over the low frequency range, so that the leading capacitive reactance phase relative to the program signal will cause the low frequency correction signal to lag in phase relative to the program signal. This phase-lagging correction voltage signal will compensate for the leading phase that otherwise would be produced at low frequencies by capacitive reactance in the real load. In the same manner, but conversely, the high frequency correction voltage from high frequency channel 148*b* has a leading phase to compensate for the phase lag that would otherwise be caused at high frequencies by the inductive reactance of the real load.

In the load correction system of FIG. 7, the input divider resistors 176*a* and 184 set the respective slopes of the high and low frequency portions of the correction signal curve of FIG. 8. The heights of the respective high and low frequency portions of the curve are adjustably established by the settings of the respective gain control potentiometers 144*b* and 146*b*. In the system of FIG. 6, the slope of the high frequency portion of the curve is set by the input divider resistor 176; while the slope of the low frequency portion of the curve is set by the sensing resistor 142*a*. The heights of the high and low frequency portions of the curve are adjustably set by the respective gain control potentiometers 144*a* and 146*a*. In the system of FIG. 5, the slopes of the high and low frequency portions of the curve are set by the values of the respective sensing resistors 136 and 142; while the heights of the high and low sections of the curve are adjustably set by the respective gain control potentiometers 144 and 146. In the system of FIG. 4, the slopes of both the high and low frequency portions of the curve are set by the single sensing resistor 34*c*; while the heights of the high and low portions of the curves are independently adjustable by the variable shunt resistors across the respective inductor and capacitor of the reference load 30*c*, and the heights of both curves are jointly adjustable by the single gain control potentiometer 102.

The performance of the FIG. 7 form of the invention is substantially the same as the performance of the FIG. 6 form of the invention, with a rise time in the range of from about 2 to about 5 microseconds, a leading phase above the 400 $H_z$ crossover frequency all of the way out to 20 $KH_z$, and the adjustments not disturbing either phase or rise time. As with the FIG. 6 form, the system of FIG. 7 has a very low harmonic distortion of about 0.1%. The harmonic distortion previously noted for the circuits of FIGS. 1–5 appeared to be principally a distortion of the third harmonic; however, such distortion is substantially eliminated in the FIG. 6 and FIG. 7 forms of the invention.

FIG. 8 shows a correction signal amplitude vs. frequency curve which is typical for the reference load correction systems of the invention illustrated in FIGS. 4–7. The curve will be similar for the systems of FIGS. 1–3, but the high frequency portion of the curve will not normally be brought up so high for the systems of FIGS. 1–3 because of the distortions referred to hereinabove that are introduced if the Q of the inductor part of the reference load is turned up too high.

By way of comparison, the curve shown in FIG. 9 is an impedance/frequency response curve given by a manufacturer for a typical speaker that is rated 8 ohms at 400 $H_z$, this curve illustrating some of the serious problems inherent in conventional speakers that are corrected by the reference load correction circuits of the present invention.

Referring at first to FIG. 8, the correction signal curve is generally designated 190, and includes high frequency portion 192 above the 400 $H_z$ crossover frequency and low frequency portion 194 below the 400 $H_z$ crossover frequency. At 400 $H_z$ there is no correction signal, and both the high frequency portion 192 and the low frequency portion 194 of curve 190 rise tangentially from the 400 $H_z$ zero point on the curve 190.

The high frequency portion 192 of curve 190 gradually slopes upwardly from the 400 $H_z$ point, and rises between about 4 and 6 decibels per octave starting at about 1,000 $H_z$ up through about 10 $KH_z$, where the curve starts to roll off, the curve going nearly flat at 20 $KH_z$. Above 20 $KH_z$ additional correction does not contribute significantly to the sound.

The low frequency portion 194 of curve 190 gradually rises below 400 $H_z$ to a slope of about 3 decibels per octave, up to about 50 $H_z$, and then rolls off and levels out all of the way down to about 5 $H_z$.

Referring to FIG. 9, the impedance curve generally designated 196 represents total speaker impedance. Above about 400 $H_z$ this impedance is the vector sum of resistance and inductive reactance; while below about 400 $H_z$ this impedance is the vector sum of resistance and some capacitive reactance of the speaker coil, but primarily a capacitive reactance effect caused by the compliance and open air cone resonance of the speaker. It will be noted from the total impedance curve 196 that the manufacturer's rating for the speaker of 8 ohms only holds approximately true within a very limited frequency range of from about 150 $H_z$ to about 600 $H_z$, and that both above and below this very limited range the total impedance of the speaker rises to much higher values. Thus, because of the inductive reactance of this load, its impedance doubles to 16 ohms at approximately 2300 $H_z$, and quadruples to 32 ohms at about 10 $KH_z$. Below about 150 ohms, the impedance curve 196 rises sharply to an impedance peak caused primarily by the cone resonance of the speaker, and then slopes back down sharply to 8 ohms at 20 $H_z$.

Since power delivered to a speaker from an amplifier, and hence acoustic output of the speaker, is inversely proportional to speaker impedance, it will be apparent from the speaker impedance curve 196 of FIG. 9 that above 400 $H_z$ the higher frequencies in the amplifier program will be greatly reduced in acoustic output relative to the lower frequencies, so that much of the overtone structure will be reduced or lost, and the formant structure of the program will be considerably adversely affected. In addition to the serious amplitude losses of the program, the inductive reactance of the speaker causes large phase lags in the load current relative to the program voltage, and such phase lags greatly increase at the higher frequencies. Thus, the phase lag angle of the load current caused by the inductive reactance of the speaker represented by the impedance curve 196 is approximately 33° at 400 $H_z$, approximately 45° at 900 $H_z$, and as high as approximately 70° at 5 $KH_z$. Such phase lag angles of the load current relative to the program signal are directly responsible for transient distortion referred to hereinabove in which the fundamental and lower harmonic frequencies mask the high frequency harmonics. The rising part of impedance curve 196 below 400 $H_z$ caused by speaker compliance and cone resonance has a leading phase, which normally will make the masking problem even worse.

The general similarity between the correction signal curve 190 of FIG. 8 provided by the present invention and the typical total speaker impedance curve 196 of FIG. 9 is to be noted. The high frequency portion 192 of the correction signal curve of FIG. 8 rises at a rate sufficient to substantially completely overcome the increase of impedance with frequency of the speaker as illustrated in the rising part of the speaker impedance curve 196 in FIG. 9. As described in detail hereinabove, the reference load correction signal provided by the present invention substantially completely corrects for the speaker phase lags indicated in FIG. 9, and the circuits of the present invention illustrated in FIGS. 4–7 will actually cause a slightly leading load current phase relative to the phase of the program signal voltage from the 400 $H_z$ crossover frequency all of the way out to 20 $KH_z$, assuring that the acoustic output of the speaker will be essentially in phase over this entire frequency spectrum.

The low frequency portion 194 of curve 190 shown in FIG. 8 does not completely compensate for the cone resonance peak, but the slope and height of the low frequency portion 194 of the curve are adjustable so that the low frequency acoustic output of the speaker or speaker system will sound good. Bringing the leveled part of the low frequency portion 194 of the curve all the way down below 20 $H_z$ assures that all of the percussion sounds will be clearly heard. A very important aspect of the reference load correction provided by the present invention in the low frequency portion 194 of curve 190 is that the low frequency correction signal has a phase lag, on the order of about 25° to 30°, which cancels the leading phase of the rising part of the cone resonance section of the speaker impedance curve.

While the reference load correction circuits embodying the present invention have been shown and described as being adapted to correct for speaker system loads, it is to be understood that the invention is equally adaptable to correct for the deficiencies of any amplifier-driven load, with the reference load circuit components being chosen as an equivalent model for the electrical and mechanical characteristics of the driven load, whatever that load may be.

In an early experimental prototype of the invention, an actual speaker load was employed as the reference load, and in other early prototypes a passive reference load 30 in the FIG. 1 configuration was employed with inductor and capacitor circuit components having values selected to correspond approximately to the inductance and capacitance found in a real speaker load. However, experimentation with such early prototypes revealed that an inductor component of the reference load of the invention not only can serve as an equivalent model for the inductance of the real speaker load, but also as an analog model for the mechanical inertia of the speaker load. The current response curve in an inductor relative to the applied program voltage is closely analogous to the mechanical response curve of a speaker relative to the applied program. If a square wave voltage pulse is applied across an inductor, the current through the inductor will lag in phase at both the leading and trailing edges of the pulse; such leading edge phase lag corresponds to mechanical inertial lag, while such trailing edge phase lag corresponds to inertial overshoot. Advantage is taken of this correspondence between inductive reactance and inertia in the embodiments of the invention illustrated in FIGS. 1–7 by providing a large enough reference load inductor to serve both as an equivalent model for the inductance of the speaker system, and additionally to serve as an analog model for the mechanical inertia of the speaker system. Thus, the inductor circuit component of the reference load is selected so that the correction signal amplitude and power are sufficient to synergistically compensate substantially completely for both the inductive reactance and the mechanical inertia of the speaker system.

Similarly, the capacitor circuit component in the reference load of the present invention has been found to be capable of serving not only as an equivalent model for the capacitance of the real speaker system load, but also as an analog model for the compliance and related open air cone resonance of the speaker system, so that the low frequency correction signal provided by the invention serves not only to compensate for the capacitive reactance of the real load speaker system, but also synergistically compensates for the compliance and cone resonance of the speaker system.

In an amplifier load correction system such as that disclosed in Crooks U.S. Pat. No. 4,260,954 wherein corrections were made in response to sensing of the real transducer load, where the load became more complex than a single speaker, as for example a plurality of speakers with crossover networks, or a multiple speaker distribution line system, such system could mask the sensing and interfere with the correction. The reference load correction system employed in the present invention has been found to completely overcome this problem, and experimental prototypes of the invention have been tested with a wide variety of speaker systems of varying complexity and have been found to be completely compatible with all of them, substantially completely correcting for speaker system reactance and inertia in all cases.

Another problem in a direct load sensing system such as that of Crooks U.S. Pat. No. 4,260,954 that is completely cured by utilizing the reference load of the present invention, is that a real load is unpredictable and often imperfect, while the reference load of the present invention is completely predictable and can serve as a substantially perfect model load. Thus, while the reference load of the present invention will correct for and substantially completely cure imperfections in the real load, when an imperfect real load is sensed as in the system of U.S. Pat. No. 4,260,954, the imperfection in the speaker system will not be corrected.

Another advantage of the reference load system of present invention over a direct load sensing system such as that of U.S. Pat. No. 4,260,954 is that the reference load system is much simpler to hook up in any amplifier-speaker system, requiring only an input jack from the preamplifier and an output jack to the power amplifier, and not requiring the additional connections to the driven load as were required in the direct sensing type of system.

The reference load of the present invention is completely separated and isolated from the driven load, and as indicated in the preceding comparisons between the reference load system of the present invention and a direct load sensing system such as that of U.S. Pat. No. 4,260,954, it will be seen that this complete separation and isolation of the reference load from the real load is a critical factor in overcoming each of the problems of the direct load sensing type of system.

In a test to illustrate the phase and transient correction characteristics of the present invention, separate, identical state-of-the-art speakers were connected to each of the two channels of a single power amplifier, and a graphic equalizer was employed to zero out the frequency responses of the speakers so that the acoustic output was flat in each of the two channels. An experimental prototype of the present invention was connected between the preamplifier and power amplifier in only one of the two channels. Upon switching back and forth between the channel that was without the reference correction system of the invention and the channel that included the reference load correction system of the invention, the audible difference was dramatic. The channel with the reference load correction system sounded just like live sound, with no masking at all, even though the program was actually a recorded program; while the channel without the reference load correction system had a "recorded" sound with much of the high frequency transient content masked.

By way of example only, and not of limitation, a type of operational amplifier that has proved to be satisfactory in the present invention is a 4558 dual operational amplifier such as that currently available as a standard chip from Motorola, National and Raytheon. This is a high performance operational amplifier with low noise and fast response characteristics.

Figure 10:
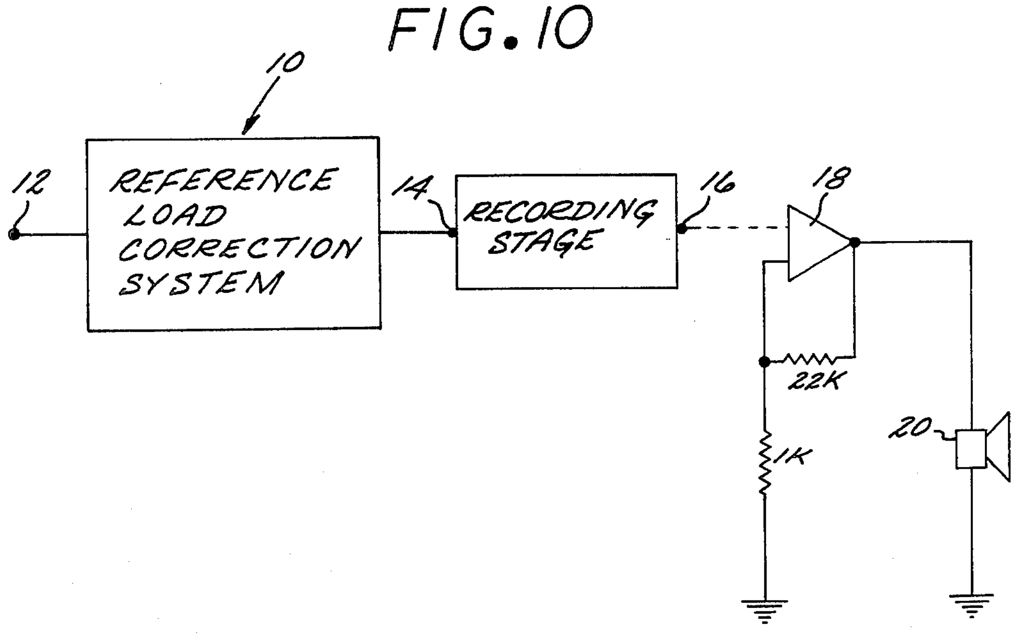
FIG. 10 is a block diagram, with some circuit components illustrated, of the circuit diagram shown in FIG. 1, but with the addition of a recording stage between the reference load correction system of the present invention and the power amplifier, for recording the program and correction signals for later simultaneous application to the power amplifier.

Although the present invention has been shown and described herein in an arrangement in which it provides the reference load correction signal directly into the amplification line which drives a load such as a speaker system, the invention may also be employed in the processing of recorded program information. Thus, the original program, whether it be live or pre-recorded, is applied to an amplification line that embodies the reference load correction system of the invention, and the resulting output program that includes the correction voltage introduced by the reference load system of the invention is recorded (or re-recorded if the program came from a prior recording). Then, when the processed recording with the reference load correction signal thereon is applied through any amplifier-load system for driving the load, the reference load correction signal on the recording will provide full correction to the load, just as in the case where the reference load correction system of the invention is physically connected in the amplifier-load line. With the reference load correction circuit thus used as a processor of sound, the speaker correction signal may be added in the commercial recording of records, sound tapes, video tapes, motion picture sound tracks, and the like. In this case, the processed correction signal is actually stored in the recording. Such an arrangement is illustrated in FIG. 10.

While the invention has been described with reference to presently preferred embodiments, it is to be understood that numerous modifications or alterations may be made by those skilled in the art without departing from the scope and spirit of the invention as set forth in the appended claims.

I claim:

1. A method of correcting for variations in a load driven by a power amplifier that has an input circuit line through which it receives a variable wave form input program voltage signal, which comprises:

applying said program signal to a reference load which has electrical characteristics that simulate characteristics of said driven load and using the response of said reference load to said program signal to develop a correction signal for said driven load, and simultaneously applying said program signal and said correction signal to said power amplifier.

2. The method of claim 1, wherein said driven load has inductive reactance and said reference load comprises inductor component means.

3. The method of claim 1, wherein said driven load has inductive reactance and inertia, and said reference load comprises inductor component means that serves both as a model for said inductive reactance of the driven load and as an analog for said inertia of the driven load.

4. The method of claim 1, 2 or 3, wherein said driven load has characteristics resembling those of capacitive reactance, and said reference load comprises capacitor component means.

5. The method of claim 1, wherein said driven load comprises audio speaker means having inductive reactance, inertia and characteristics resembling those of capacitive reactance, said reference load comprising inductor component means that serves both as a model for said inductive reactance of the speaker and as an analog for said inertia of the speaker, and said reference load comprising capacitor component means.

6. The method of claim 1, wherein said driven load has both inductive reactance and characteristics resembling those of capacitive reactance, and said reference load comprises both inductor component means and capacitor component means.

7. The method of claim 6, wherein said inductor and capacitor component means comprise tuned circuit means.

8. The method of claim 7, wherein said circuit means is tuned at approximately 400 $H_z$.

9. The method of claim 6, which comprises adjusting the amplitude of correction signal components developed from said inductor and capacitor component means by adjusting the values of variable shunt resistors across the respective inductor and capacitor component means.

10. The method of claim 6, wherein said program signal is applied to said inductor component means in a separate high frequency channel and to said capacitor component means in a separate low frequency channel, separate high and low frequency correction signal components being produced in the respective high and low frequency channels and being mixed with the program signal and applied to said power amplifier.

11. The method of claim 10, wherein the amplitude of each of said high and low frequency correction signal components is independently adjustable in its respective channel.

12. The method of claim 10, wherein said high and low frequency correction signal components and said program signal are applied to said power amplifier through a summing amplifier.

13. The method of claim 10, wherein the response of at least one of said reference load component means to said program signal is used to develop a feedback voltage signal which varies substantially in accordance with variations in reference load current through said one component means, and continuously comparing said feedback voltage signal with said input program signal in differential amplifier means to develop a component of said correction signal.

14. The method of claim 10, wherein the response of each of said reference load component means to said program signal is used to develop a respective feedback signal which varies substantially in accordance with variations in reference load current through the respective said component means, and continuously comparing each of said feedback voltage signals with said input program signal in differential amplifier means to develop a respective component of said correction signal.

15. The method of claim 10, wherein the response of at least one of said reference load component means to said program signal is developed in voltage divider means containing said one component means and across which said program signal is applied.

16. The method of claim 10, wherein the response of each of said reference load component means to said program signal is developed in a respective voltage divider means containing the respective component means and across which said program signal is applied.

17. The method of claim 1, wherein the response of said reference load to said program signal is used to develop a feedback voltage signal that varies substantially in accordance with variations in reference load current, and continuously comparing said feedback voltage signal with said input program signal in differential amplifier means to develop said correction signal.

18. The method of claim 1, wherein the response of said reference load to said program signal is developed in voltage divider means containing said reference load and across which said program signal is applied.

19. The method of claim 1, which comprises developing said correction signal, cancelling program signal that may be admixed with said correction signal when it is developed to isolate said correction signal, adjusting the amplitude of said isolated correction signal, and mixing said adjusted correction signal with said program signal and applying the mixture to said power amplifier.

20. The method of claim 1, wherein current draw through said reference load is minimized by having the values of the electrical characteristics of the reference load much higher than the corresponding characteristics of said driven load.

21. A load correction system for a power amplifier having a program input adapted for connection to a source of program voltage signal that is variable as to waveform, and having an output connected to a driven load, which comprises:

reference load means having input means electrically connected to said program signal source and output means electrically connected to said power amplifier, said reference load means having electrical characteristics that simulate characteristics of said driven load, and circuit means electrically connected to said reference load means and responsive to the reaction of said reference load means to said program signal to develop at said output means a correction signal for said driven load that is delivered to said power amplifier.

22. A load correction system as defined in claim 21, wherein said driven load has inductive reactance and said reference load comprises inductor component means.

23. A load correction system as defined in claim 21, wherein said driven load has inductive reactance and inertia, and said reference load comprises inductor component means that serves both as a model for said inductive reactance of the load and as an analog for said inertia of the load.

24. A load correction system as defined in claims 21, 22 or 23, wherein said driven load has characteristics resembling those of capacitive reactance, and said reference load comprises capacitor component means.

25. A load correction system as defined in claim 21, wherein said driven load comprises audio speaker means having inductive reactance, inertia and characteristics resembling those of capacitive reactance, said reference load comprising inductor component means that serves both as a model for said inductive reactance of the speaker and as an analog for said inertia of the speaker, and said reference load comprising capacitor component means.

26. A load correction system as defined in claim 21, wherein said driven load has both inductive reactance and characteristics resembling those of capacitive reactance, and said reference load comprises both inductor component means and capacitor component means.

27. A load correction system as defined in claim 26, wherein said inductor and capacitor component means comprise tuned circuit means.

28. A load correction system as defined in claim 27, wherein said tuned circuit means is tuned at approximately 400 $H_z$.

29. A load correction system as defined in claim 26, which comprises a variable shunt resistor across each of said inductor and capacitor component means for adjusting the amplitude of the correction signal component developed from the respective component means.

30. A load correction system as defined in claim 26, which comprises a separate high frequency electrical channel containing said inductor component means and a high frequency portion of said circuit means, and a separate low frequency electrical channel containing said capacitor component means and a low frequency portion of said circuit means, separate high and low frequency correction signal components being produced in the respective high and low frequency channels, and a separate program frequency electrical channel, each of said channels having an input that is electrically connected to said input means and an output, said outputs being connected together ahead of said output means so as to mix said correction signal components and said program signal for delivery to said power amplifier.

31. A load correction system as defined in claim 30, which comprises gain adjustment means in each of said channels for independently adjusting the amplitude of each of said high and low frequency correction signal components.

32. A load correction system as defined in claim 30, which comprises a summing amplifier electrically connected between said connection together of said channel outputs and said output means.

33. A load correction system as defined in claim 30, wherein said circuit means portion in at least one of said channels comprises differential amplifier means having an output electrically connected to the respective channel output and having a pair of inputs, and reference load current sensing resistor means electrically connected in series with the respective reference load component means in said one channel so as to develop a feedback signal which varies substantially in accordance with variations in current through the respective reference load component means, one of said pair of inputs being connected to said sensing resistor means to receive said feedback signal, and the other of said pair of inputs being connected to said input means to receive said program signal.

34. A load correction system as defined in claim 33, wherein each of said channels comprises a respective said differential amplifier means and a respective said sensing resistor electrically connected as in said one channel.

35. A load correction system as defined in claim 30, wherein said circuit means portion of at least one of said channels comprises voltage divider means having as one of its elements the respective reference load component means, said voltage divider means having an input connected to the respective channel input and an output connected to the respective channel output.

36. A load correction system as defined in claim 35, wherein each of channels comprises a respective said voltage divider means electrically connected as in said one channel.

37. A load correction system as defined in claim 21, wherein said circuit means comprises differential amplifier means having an output electrically connected to said output means and having a pair of inputs, and reference load current sensing resistor means in series with said reference load so as to develop a feedback signal which varies substantially in accordance with variations in current through the reference load means.

38. A load correction system as defined in claim 21, wherein said circuit means comprises voltage divider means having as one of its elements said reference load means, said voltage divider means an input connected to said input means and an output connected to said output means.

39. A load correction system as defined in claim 21, which comprises a first separate channel between said input and output means containing said reference load means and said circuit means, and a second channel between said input and output means for conducting the program signal, said first channel comprising program cancellation circuit means for cancelling said program in said first channel so as to isolate the correction signal, and variable gain means in said first channel for adjusting the gain of said isolated program signal.

40. A load correction system as defined in claim 21, wherein the values of the electrical characteristics of the reference load are much higher than those of the driven load so as to inimize current draw through the reference load.

41. A method of preparing a recording of a variable wave form program voltage signal which is adapted to correct for variations in a load driven by a power amplifier that has an input circuit line through which it is adapted to have said recording played, which comprises:

applying said program signal to a reference load which has electrical charracteristics that simulate characteristics of said driven load and using the response of said reference load to said program signal to develop a correction signal for said driven load, and recording said program and correction signals for later simultaneous application to said power amplifier.

42. The method of claim 41, wherein said driven load comprises audio speaker means having inductive reactance, inertia and characteristics resembling those of capacitive reactance, said reference load comprising inductor component means that serves both as a model for said inductive reactance of the speaker and as an analog for said inertia of the speaker, and said reference load comprising capacitor component means.

* * * * *